455-296 SR
FIP8106 XR 2,852,623
TX 5432E
SEARCH ROOM
Sept. 16, 1958 J. N. BRYANT 2,852,623
VERSATILE IMPULSE NOISE LIMITER OR THE LIKE
Filed Jan. 3, 1956
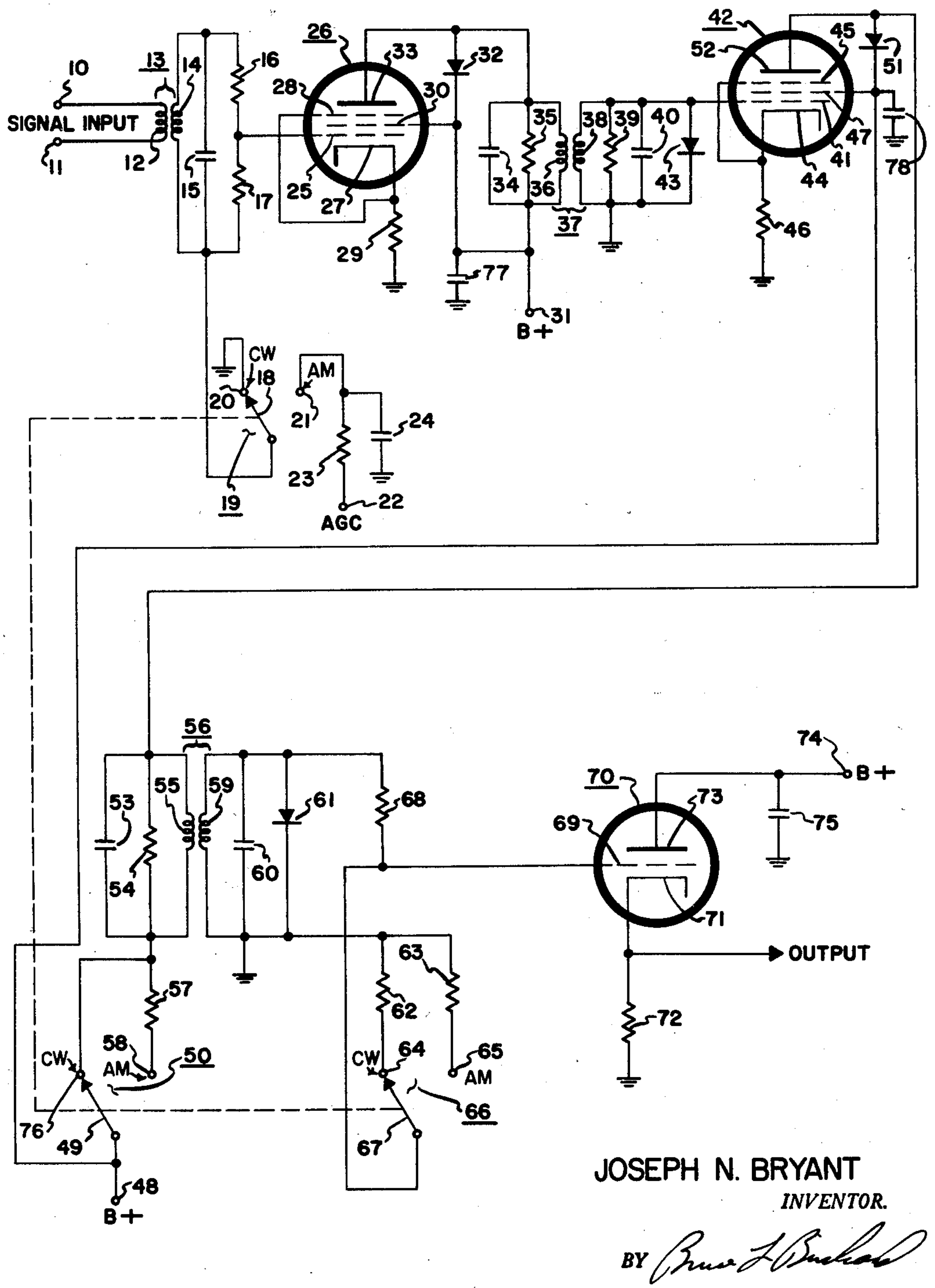
JOSEPH N. BRYANT
*INVENTOR.*
BY Bruce L. Birchard
HIS ATTORNEY
2852623

United States Patent Office 2,852,623
Patented Sept. 16, 1958

2,852,623

VERSATILE IMPULSE NOISE LIMITER OR THE LIKE

Joseph N. Bryant, Los Angeles, Calif., assignor to Hoffman Electronics Corporation, a corporation of California Application January 3, 1956, Serial No. 556,913

4 Claims. (Cl. 179—171)

This invention is related to low-level noise limiters adapted for incorporation in radio receiving apparatus, and more particularly to a new and improved limiter circuit which is selectively adaptable for limiting impulse or random noise associated with either an incoming continuous wave (C. W.) signal or an incoming amplitude modulated (AM) signal.

In the past, there have been several types of low-level noise limiter circuits devised for incorporation, for example, between the mixer stage and I.-F. strip of a conventional radio receiver. In radio receivers which are adapted for the reception of either C. W. or AM signals, noise limiters which may be incorporated in such radio receivers as have hitherto been devised do not provide for variation of limiting level in accordance with the type of signal being received; further, it does not appear in the prior art examined that by switch means the variation in limiting level, for the reception of AM signals, for example, may be accompanied by corresponding, AGC compensation of the amplitude of the input signal to the limiter, so that the limiter circuit will exhibit the same over-all gain for all types of signal being received in addition to precluding the possibility of removal of the modulation components of an incoming AM signal by the limiter circuit. A variation in limiting level which may be selectable is of course desirable since, while limiting of C. W. signals may be desirable at a low level, yet the limiting of AM signals must be at a higher level so as not to be so severe as to impair or remove the modulation components thereof.

Therefore, it is an object of the present invention to provide a new and useful, versatile, impulse noise limiter which is selectively adaptable for limiting either AM or C. W. signals.

It is a further object of the present invention to provide a new and useful, versatile, impulse noise limiter in which desired changes in limiting level will be accompanied simultaneously by gain compensation of the limiter system.

It is a still further object of the present invention to provide a versatile impulse noise limiter in which, by single switch means, an automatic gain control circuit may be switched into the limiter together with the limiting level adjusting means, for improved radio receiver performance.

According to the present invention, an incremental noise suppressor type of limiter, for example, has at least one stage provided with a parallel resonant circuit shunted by a diode, which diode may be selectably back-biased for exhibiting an increased limiting level. A subsequent stage is provided with selectable means for adjusting the input signal level thereto so that the gain of the system will remain susbtantially constant. An automatic gain control voltage is switched in or out of the limiter circuit in accordance with the type of signal being received.

The features of the present invention which are believed to be novel are set forth with particularity in the appended claims. The present invention, both as to its organization and manner of operation, together with further objects and advantages thereof, may best be understood by reference to the following description, taken in connection with the accompanying drawing, in which:

The sole figure is a schematic diagram of a versatile impulse noise limiter according to the present invention.

In the sole figure, input terminals 10 and 11 are coupled across primary winding 12 of transformer 13. Secondary winding 14 of transformer 13 is coupled across capacitor 15 and also across the series-connected combination of resistor 16 and resistor 17. The parallel combination of secondary winding 14, capacitor 15, and series-connected resistors 16 and 17 is connected to switch arm 18 of switch 19. Switch 19 also includes contact 20, which is grounded, and contacts 21 which, itself, is adapted for coupling to a source of automatic gain control voltage. Thus, contact 21 is coupled to AGC terminal 22 through resistor 23 (which is an isolation resistor) and is also by-passed to ground through filter capacitor 24. The R–C time constant of resistor 23 and capacitor 24 must be chosen sufficiently short for proper AGC response at the highest modulation frequency to be received. The junction of resistors 16 and 17 is connected to control electrode 25 of vacuum tube 26. Cathode 27 is connected to suppressor electrode 28 in a conventional manner and is also coupled through cathode resistor 29 to ground. Degenerative feedback is utilized in the pentode amplifier stages, by virtue of the inclusion of an unby-passed cathode resistor in each of the two cathode circuits and also the permissibly includable screen by-pass capacitors 77 and 78, so as to flatten the frequency-response characteristic of both tubes and also to extend the range of uniform response of the amplifiers. It is of course understood that the cathode resistors might have been by-passed by appropriate capacitors, if desired; or indeed, other types of bias might reasonably have been employed. Screen electrode 30 is connected to B+ terminal 31 and also through diode 32 to anode 33 of vacuum tube 26. Anode 33 is also coupled through the parallel resonant circuit combination of capacitor 34, resistor 35, and primary winding 36 (of transformer 37) to B+ terminal 31. The several resistors inserted in shunt across the several tuned circuits are employed for the purpose of lessening the ring time of those circuits in the presence of high amplitude impulse noise. Secondary winding 38 of transformer 37 is shunted by resistor 39 and by capacitor 40 to form a parallel combination one end of which is grounded and the remaining end being coupled to control electrode 41 of vacuum tube 42. Diode 43 is also coupled between control electrode 41 and ground. Cathode 44 is directly connected to suppressor electrode 45 in a conventional manner and also through unby-passed, cathode resistor 46 to ground. Screen electrode 47 is connected to B+ terminal 48, to switch arm 49 of switch 50, and through diode 51 to anode 52 of vacuum tube 42. Anode 52 of vacuum tube 42 is also coupled by the parallel combination of capacitor 53, resistor 54, and primary winding 55 of transformer 56 to switch contact 76, and through back-biasing resistor 57 to contact 58 of switch 50. The secondary winding 59 of transformer 56 is shunted by capacitor 60, and by diode 61. One end of the latter parallel combination is grounded and is also coupled through the parallel combination of resistors 62 and 63 to switch contacts 64 and 65, respectively, of switch 66. Switch arm 67 of switch 66 is coupled through resistor 68 to the remaining end of the last mentioned parallel combination and also to control electrode 69 of vacuum tube 70. Cathode 71 of vacuum tube 70 is coupled to ground through cathode load resistor 72, across which the output signal will be taken. Anode 73 of vacuum tube 70 is connected directly to B+ terminal 74 and to ground through R.-F. by-pass capacitor 75.

The tube stage including triode vacuum tube 70 is of course a cathode follower having a low impedance output. The input to vacuum tube 70 includes a selectable voltage divider network including resistor 68, resistor 62, and resistor 63. As is shown, by the appropriate positioning of arm 67 of switch 66, either resistor 62 or resistor 63 may be placed in series with resistor 68. By such an arrangement, a selectable portion of the signal developed across the parallel resonant circuit including secondary winding 59 may be applied to control electrode 69 of vacuum tube 70. Suppose for example that contact 64 of switch 66 is the C. W. contact and that contact 65 is the AM contact. Representative values of resistors 62 and 63 might be 560 ohms and 1,000 ohms, respectively. In the switch position shown for switch 66, then, the voltage supplied to control electrode 69 of vacuum tube 70 would be substantially less, in comparison with the total voltage developed across secondary winding 59, than were switch arm 67 in contact with AM switch contact 65. To summarize, the signal strength supplied to control electrode 69 of vacuum tube 70 will be greater for AM reception than for C. W. reception, owing to the selective positioning of switch arm 67 of switch 66. A greater signal input to tube 42 will be required, in the case of AM reception, to actuate the AGC system of the receiver so as to prevent the elimination of the modulation components of a strong incoming signal by the limiter, and, in addition, to stabilize the limiting level for all incoming signal strengths. This is the built-in, compensating feature of this invention which compensates for the effect of the insertion or withdrawal of back-biasing resistor 57 in the anode circuit of vacuum tube 42 so that gain may be stabilized for all types of reception. It is seen with reference to the tube stage including pentode tube 42 that when switch arm 49 is disposed as shown that B+ voltage is directly supplied the parallel resonant circuit including capacitor 53, resistor 54, and primary winding 55 so that for a given signal voltage level diode 51 will commence to limit. The limiting level will be raised an appreciable amount when resistor 57, having a value of 1500 ohms for example, is inserted in series between B+ terminal 48 and the associated anode resonant circuit. Because of the rather high impedance of the parallel resonant circuit including capacitor 53 and primary winding 55 in comparison to the moderate resistance value of resistor 57, the ripple voltage developed across resistor 57 will not be overly significant. However, the D. C. component of the anode current flowing through resistor 57 will develop a back-bias voltage for application to diode 51, thus causing diode 51 to limit at a much higher level than before. Thus, for AM reception the limiting level of the tube stage including vacuum tube 42 will be appreciably higher than for C. W. reception. This is to be desired since, for AM reception, precaution should be taken against eliminating the modulation components of the input signal. Thus, the limiting level should be somewhat above the anticipated peak value of the modulated signal at 95–100% modulation. But if, for example, switches 50 and 66 are ganged, then, for AM reception, the increased limiting level of tube stage 42 will be counter-balanced by an increased voltage divider signal applied to control electrode 69, which in turn provides for a greater AGC voltage.

Referring now to tube stage 26, it is conventional that AGC or delayed AGC is utilized for AM reception, but not for C. W. reception. Presumably, AGC voltage will be supplied, selectively, to at least two R.-F. preselector stages, also. The reason for the deletion of AGC in a C. W. receiver or receiving system having capabilities of translating a 3 microvolt signal, for example, is that it is desired to perform all of the R.-F. limiting action at a low level in the limiter itself, between the mixer and I.-F. strip, for example. Thus, switch 19 may also be ganged to the combination of switches 50 and 66 so that for C. W. reception, the AGC voltage supply will be switched out of the input circuit whereas for AM reception the AGC voltage will be supplied in the input of vacuum tube 26.

Theoretically, in the case of incremental noise limiters, the last diode in the limiter circuit will perform its limiting function first, with additional limiting being supplied for greater incoming signal strengths by each of the preceding diodes, in order; hence, it might be thought that the last diode or diode nearest the I.-F. strip of the receiver, e. g. diode 61, should be supplied the insertable back-bias. In actual practice, however, diode 51, that is the next to last diode will limit first, owing to the small coefficient of coupling of transformer 56. Thus, it has become practical to employ the back-biasing resistor, i. e. resistor 57 in conjunction with diode 51 in tube stage 42.

While particular embodiments of the present invention have been shown and described, it will be obvious to those skilled in the art that changes and modifications may be made without departing from this invention in its broader aspects, and, therefore, the aim in the appended claims is to cover all such changes and modifications as fall within the true spirit and scope of this invention.

I claim:

1. A limiter circuit including, in combination, an amplifier stage having a tuned circuit, a switch disposed in series relationship with said tuned circuit, said switch having a switch arm contact and first and second selectable contacts, said first selectable contact being connected directly to said tuned circuit, a resistor coupled between said second selectable contact and said tuned circuit, said switch arm contact being adapted for coupling to a source of positive voltage, and a diode shunting said tuned circuit and said switch.

2. In combination, the apparatus as defined in claim 1; a second stage having a vacuum tube with a control electrode, an input circuit, and an output circuit; said input circuit including a tuned circuit coupled to said tuned circuit of said claim 1 apparatus, first, second, and third resistors each having a first end terminal and a second end terminal; said first end terminal of said first resistor being connected to one end of said tuned circuit; said first end terminals of said second and third resistors being connected to the remaining end of said tuned circuit; a switch having a switch arm contact connected to said second end terminal of said first resistor and first and second selectable contacts connected respectively to said second end terminals of said second and third resistors; said switch arm contact also being connected to said control electrode of said vacuum tube; and said switch being mechanically coupled to the said switch of the said apparatus of claim 1.

3. In combination, the apparatus as defined in claim 2, a third stage having a signal input circuit and an output circuit, said input circuit of said third stage including a tuned circuit with first and second end terminals, said output circuit being coupled to the input side of said amplifier stage a switch having a switch arm contact connected to said first end terminal of said tuned circuit, a first selectable contact maintained at a common reference potential, and a second selectable contact, said second selectable contact being adapted for coupling to a source of automatic gain control voltage, said switch being mechanically coupled to the said switches of claim 2.

4. In combination, the apparatus as defined in claim 2, a third stage having a signal input circuit and an output circuit, said input circuit of said third stage including a tuned circuit with first and second end terminals, said output circuit being coupled to the input side of said amplifier stage, a switch having a switch arm contact connected to said first end terminal of said tuned circuit, a first selectable contact maintained at a common reference potential, and a second selectable contact, said second selectable contact being adapted for coupling to a source of automatic gain control voltage, said switch being coupled to the said switches of claim 2.

References Cited in the file of this patent

UNITED STATES PATENTS

| | | |
|---|---|---|
| 2,186,291 | Griffen | Jan. 9, 1940 |
| 2,227,197 | Percival | Dec. 31, 1940 |
| 2,259,532 | Nicolson | Oct. 21, 1941 |
| 2,318,075 | Hollingsworth | May 4, 1943 |
| 2,387,666 | Lawrence | Oct. 23, 1945 |
| 2,447,564 | Carnaham | Aug. 24, 1948 |
| 2,608,651 | Emmett | Aug. 26, 1952 |
| 2,653,229 | Ingalls et al. | Sept. 22, 1953 |

FOREIGN PATENTS

| | | |
|---|---|---|
| 676,786 | Great Britain | Aug. 6, 1952 |